United States Patent [19]

Bishop

[11] Patent Number: 4,633,418

[45] Date of Patent: Dec. 30, 1986

[54] BATTERY CONTROL AND FAULT DETECTION METHOD

[75] Inventor: Wayne S. Bishop, Centerville, Ohio

[73] Assignee: The United States of America as represented by the Secretary of the Air Force, Washington, D.C.

[21] Appl. No.: 629,865

[22] Filed: Jul. 11, 1984

[51] Int. Cl.⁴ .................. G06F 15/20; G01N 27/46
[52] U.S. Cl. .................................. 364/554; 320/39; 320/43; 320/48; 324/434; 340/636; 364/483
[58] Field of Search ............... 364/480, 481, 483, 550, 364/554; 340/636, 825.16; 324/426, 434; 320/39, 43, 48

[56] References Cited

U.S. PATENT DOCUMENTS

| | | | |
|---|---|---|---|
| 3,863,060 | 1/1975 | Rode et al. | 364/408 |
| 3,872,457 | 3/1975 | Ray et al. | 340/249 |
| 4,198,597 | 4/1980 | Sawyer | 324/434 |
| 4,217,645 | 8/1980 | Barry et al. | 364/483 |
| 4,316,185 | 2/1982 | Watrous et al. | 340/636 |
| 4,388,618 | 6/1983 | Finger | 340/636 |
| 4,484,140 | 11/1984 | Dieu | 324/434 |
| 4,562,548 | 12/1985 | Andersen et al. | 364/483 |
| 4,564,798 | 1/1986 | Young | 320/48 |

Primary Examiner—Errol A. Krass
Assistant Examiner—Kevin J. Teska
Attorney, Agent, or Firm—Bernard E. Franz; Donald J. Singer

[57] ABSTRACT

This is a method for control, fault detection, fault isolation, and state-of-health monitoring of batteries and battery arrays. The method consists of measuring all of the battery, cell, or cell group voltages, using statistics to determine a means voltage and a standard deviation voltage, then comparing all of the measured voltages to the mean voltage. If the measured voltage deviates from the mean voltage by an arbitrary amount (number of standard deviations) corrective action can be implemented or an alarm signal given. The measurements need to be made rapidly enough to eliminate battery or cell voltage changes due to state of charge or temperature changes and, in most cases, require a computerized data collection/reduction system. Absolute high and/or low voltage limits can be included to prevent catastrophic events. The concept can be expanded to include similar temperature, pressure and/or battery current measurements in an array.

4 Claims, 2 Drawing Figures

BATTERY CONTROL AND FAULT DETECTION METHOD

RIGHTS OF THE GOVERNMENT

The invention described herein may be manufactured and used by or for the Government of the United States for all governmental purposes without the payment of any royalty.

BACKGROUND OF THE INVENTION

The present invention relates generally to battery control and fault detection, and more particularly to monitoring of batteries and battery arrays for state of health and fault isolation.

Battery monitor circuits are known as shown in the following U.S. Pat. No. 4,316,185 to Watrous et al discloses a battery monitor circuit that provides an indication of battery failure independent of temperature, load and age, by continuously comparing the impedance of the cells of the battery against each other. U.S. Pat. No. 4,217,645 to Barry et al shows a system for automatically monitoring cells in a battery system using a microprocessor. The information is stored and averaged within the microprocessor and an alarm provided if any cell exceeds specified limits. In U.S. Pat. No. 3,872,457 to Ray et al the battery monitor continuously scans individual cells in succession. U.S. Pat. No. 4,198,597 to Sawyer employs light emitting diode indicators which identify individual faulty cells. Finger in U.S. Pat. No. 4,388,618 senses the state of charge of a battery by operating on bidirectional integrations of terminal voltage.

Usually set control limits or failure criteria are used in battery control/monitoring systems. As the battery ages, the temperature changes, or the charge and discharge rates change, the control limits must be modified.

SUMMARY OF THE INVENTION

An object of the invention is to provide for monitoring of a battery or battery array without the need for set control limits or failure criteria.

This invention provides for automatically varying the control limits without the need for outside inputs. The method is compatible with autonomous power system technology and avoids the need to develop extensive parametric models for control.

This invention provides a method for control, fault detection, fault isolation, and state-of-health monitoring of batteries and battery arrays. The method consists of measuring all of the battery, cell, or cell group voltages, using statistics to determine a mean voltage and a standard deviation voltage, then comparing all of the measured voltages to the mean voltage. If the measured voltage deviates from the mean voltage by an arbitrary mount (number of standard deviations) corrective action can be implemented or an alarm signal given. The measurements need to be made rapidly enough to eliminate battery or cell voltage changes due to state of charge or temperature changes and, in most cases, require a computerized data collection/reduction system. Absolute high and/or low voltage limits can be included to prevent catastrophic events. The concept can be expanded to include similar temperature and battery current measurements in an array.

Novel features include not using predetermined set control limits but allowing the battery or cell to establish its own behavior relative to the other elements in an array, permitting control limits to vary continuously over the useful life of the battery, and the use of a statistical approach to determine normal battery behavior or operation.

FIG. 1 is a block and schematic diagram of a system showing a battery with charging, load and test apparatus; and FIG. 2 is a flow chart of the monitoring method according to the invention.

DETAILED DESCRIPTION

This invention provides a technique for measuring battery, module, and/or individual cell parameters of voltage, temperature, pressure, and/or current using these parameter values to control battery operation or monitor state of health. Usual practice is to establish parameter limits to control battery operation or measure its health. This technique measures the same parameter in a short period of time for all of the elements in the array, calculates a mean value and standard deviation for the measured parameter values. Each of the measured parameter values are then compared to the mean value and those that deviate more than a predetermined number of standard deviations are highlighted or used to initiate warning or corrective actions. Furthermore, the mean parameter value can be used as a control parameter and maximum or minimum absolute limits can be used if desired to prevent catastrophic failures or battery damage. Individual cell parameters can be measured and used; however, for large batteries or arrays of batteries it may be more efficient to use groups of cells, modules, or total batteries.

Figure 1:
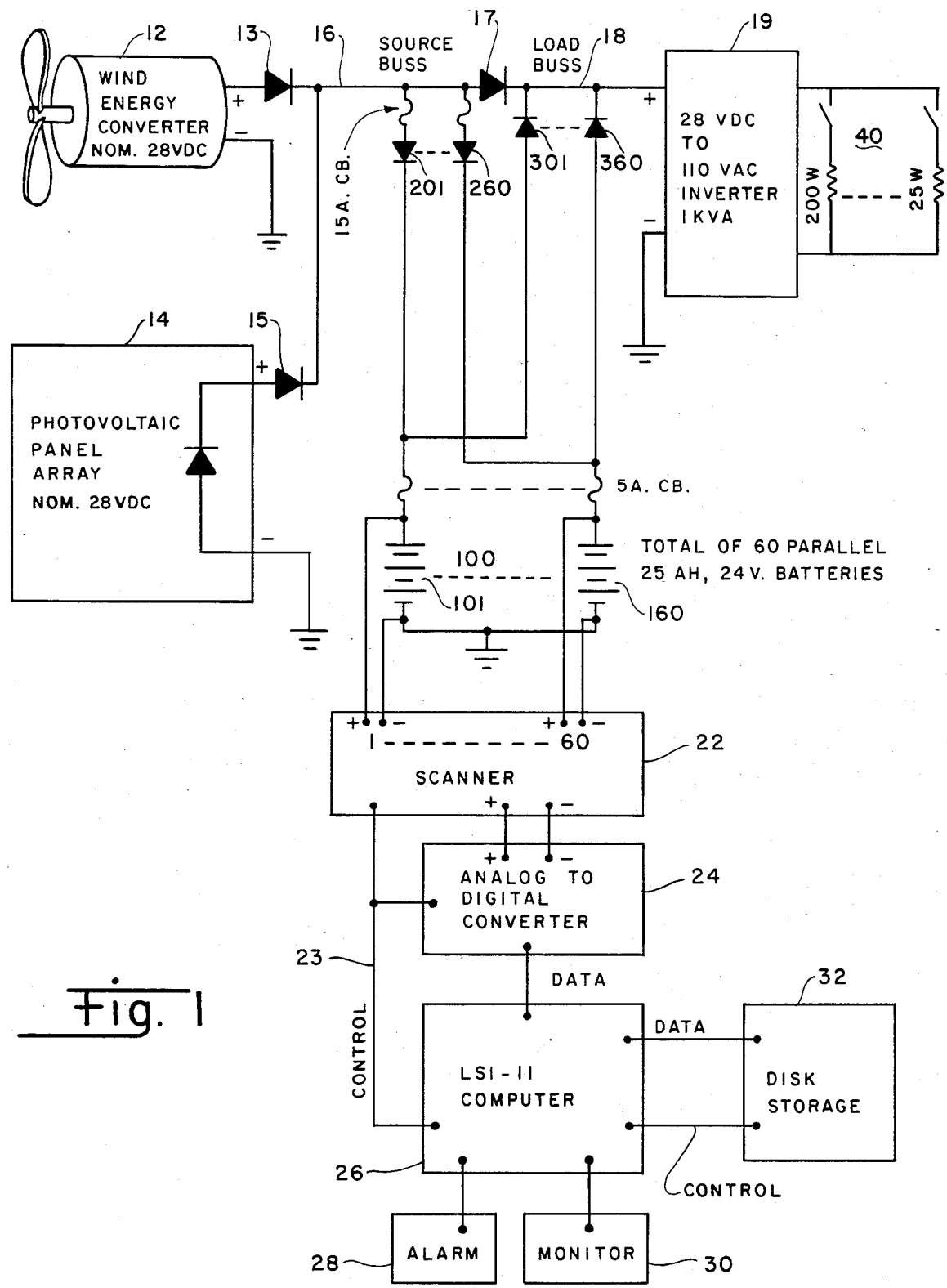

Referring to FIG. 1, an experimental battery array 100 was used to verify the technique. The experimental verification used voltage as the measured parameter. The voltage was used to indicate state of health and also control the "Turn On" point of an inverter. The Battery Array consisted of sixty (60) batteries 101–160 connected electrically in parallel but isolated electrically from each other by diodes. Each battery consisted of two (2) cell packs (modules) of six (6) cells each connected electrically in series. The voltage of each battery was measured every six (6) seconds and stored using an electrical scanner 22 and Digital Equipment Corporation, model LSI-11, digital computer 26. After each set of sixty measurements the mean battery voltage was calculated for the group along with the standard deviation for the battery voltages. Each of the measured battery voltages was compared to the mean battery voltage and those that exceeded two (2) standard deviations (an arbitrary limit) of the voltage were highlighted on a video terminal 30 as being out of limits. The battery voltages were displayed on a video screen so that the battery location could easily and rapidly be determined. The direct current to alternating current inverter 19 used in the experiment had a low voltage cut out so that when the battery discharged to the low voltage limit the inverter turned off. When the battery was recharged to a preset level, based on the mean battery voltage as the control parameter, the computer turned the inverter back on (via a line not shown).

The limits were later changed to ±3 standard deviations to reduce nuisance out of limit signals. During the first six months of operation, a single battery cell failed in one of the sixty batteries each consisting of 12 cells (i.e. 720 total cells in the 60-battery array). The computer detected this cell failure as an out of limit condition. Using the video terminal readout, it was possible to isolate the failed cell to a single battery. The failed cell was then isolated by first checking battery module voltages (6 cells per module), and then checking cell voltages in the suspect module. Using this technique, the defective cell was noted, isolated and replaced in less than 5 minutes.

In statistics, deviation is defined as the the algebraic difference found by subtracting some fixed number, usually the arithmetic mean of a series of statistical data, from any item of the series. The standard deviation is the square root of the arithmetic mean of the squares of the deviations of the various items from the arithmetic mean of the whole.

In more detail, the apparatus shown in FIG. 1 includes a nominally 28-volt source for charging the batteries and supplying power to the load, comprising a wind energy converter 12 and a photovoltaic panel array 14 coupled via respective isolation diodes 13 and 15 to a source buss 16. The source buss 16 is connected via circuit breakers and diodes in 60 separate paths to the batteries. For example, the path to battery 101 comprises a 15-ampere circuit breaker, a diode 201, and a 5-ampere circuit breaker in series. For each battery, the junction of the diode and the 5-ampere circuit breaker is connected via another diode to a load buss 18. For example, for battery 101 the cathode of diode 201 is connected via a diode 301 to the load buss 18. A feature invented by applicant is a by-pass diode 17 connected directly from the source buss 16 to the load buss 18. The load is shown as a 28-volt DC to 110-volt AC inverter rated at 1 kilovolt-ampere. The output of the inverter supplies a typical load, which for experimental purposes comprises several devices 40, each having a series switch. The devices 40 may be lamps rated at from 25-200 watts.

When the voltage from either generator 12 or 14 to the source buss 16 is sufficiently high, power is supplied via the diodes 201-260 to charge the batteries, and also via diode 17 and the load buss 18 to the load. Note that the voltage drop from the source buss 16 to the load buss 18 is that of the single diode 17 rather than across two diodes. When the voltage on the source buss 16 drops, power is supplied from the batteries via diodes 301-360 in parallel to the load.

The apparatus for performing the fault detection method comprise a scanner 22 coupled via an analog-to-digital converter 24 to the computer 26. A disk-storage unit 32 is also connected to the computer for storing the data. The monitor 30 includes a video display. An alarm device 28 is connected to the computer to signal detection of an out-of-limit battery.

Figure 2:
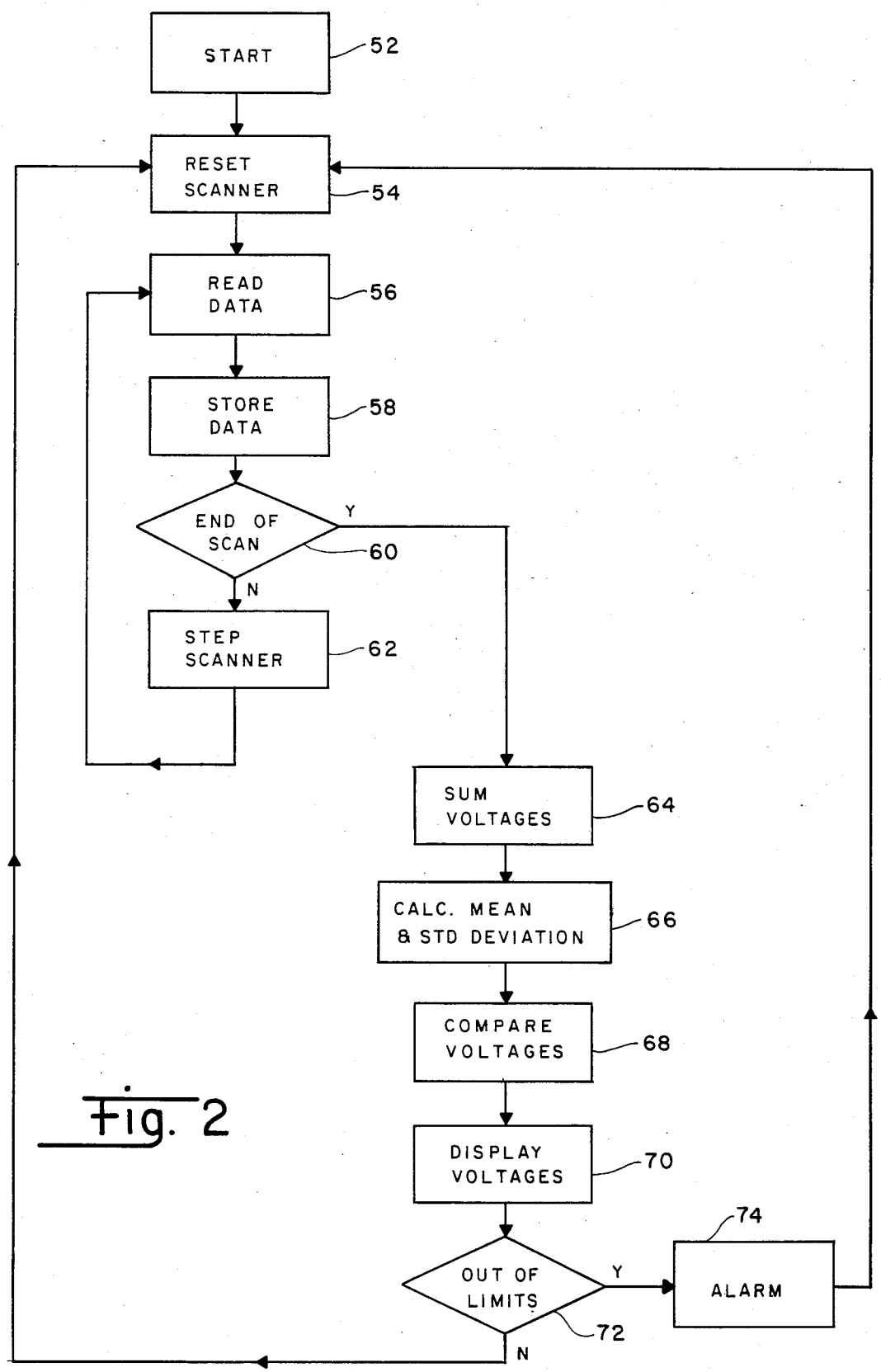

The program for the fault detection method is shown by a flow chart in FIG. 2. It begins with start instructions 5, followed by an instruction 54 to reset the scanner. A signal is supplied via a control line 23 to reset the scanner 22 to position 1. The read data instructions 56 cause the voltage of battery 101 to be read, digitized in the converter 24, and supplied to the computer 26. The store data instructions 58 cause the data to be stored in unit 32. A decision is made at block 60 that this is not the end of scan, and the step scanner instructions 62 cause a control signal to be supplied to the scanner to advance it to step 2. The program continues to cycle until the voltages of all sixty batteries are read and stored, at which time the decision block 60 causes the program to branch to the sum-voltage instructions 64.

At block 64 the voltages of the sixty batteries are added together to obtain the sum voltage.

$$Vs = V_1 + V_2 + \ldots + V_{60}$$

At block 66 the arithmetic mean is calculated by dividing the summed voltage value by 60.

$$Vm = Vs/60$$

Then the deviation for the voltage of each battery is found as the algebraic difference between its voltage and the mean value. For any battery i the deviation is $$Vd_i = V_i - Vm$$

The deviations are then each squared, the resulting values are summed and the sum is divided by 60. The square root is taken of the result to obtain the standard deviation.

$$\sigma^2 = (Vd_1^2 + Vd_2^2 + \ldots + Vd_{60}^2)/60.$$

At block 68, the voltage deviation for each battery is compared to three times the standard deviation, and any with a greater deviation are flagged as being out of limit.

Is $Vd_i > 3\sigma$? If yes, flag $V_i$.

At block 70, the voltages are displayed. Any value that is out of limit is highlighted or indicated.

At block 72 a decision is made as to whether there were any out of limit values. If there were none, then the program returns to block 54 to reset the scanner and initiate another scan. If one or more values are out of limit, then the program branches to block 74 to initiate an alarm, and then return to block 54.

The experimental system included a feature not shown in the drawing. The inverter 19 being used included a circuit to turn itself off whenever the voltage on the load buss 18 fell below a predetermined value. The circuit had a momentary-close pushbutton for manual reset. The experimental system had a two-wire line connected across this pushbutton to a switching device in the computer 26. The program included a comparison of the mean voltage to a selected value greater than the predetermined shut down value of the inverter 19, and any value greater than the selected value turned on the switching device momentarily to reset the inverter.

The technique may also be used for measuring parameters other than voltage, such as temperature, pressure, and/or current to control the battery operation or monitor state of health.

Various modifications may be made to the present invention without departing from the spirit or the scope of the following claims. A "given number" in the claims may be a single cell in each unit, or any other convenient number. In the specific embodiment, each unit comprises twelve cells in series.

I claim:

1. The method of monitoring the condition of a battery by monitoring at least one parameter, wherein the battery comprises a plurality of units, each unit comprising a given number of cells connected in a given manner, said method comprising the steps of:

scanning the units and measuring and storing the value of said parameter for each unit, deriving a mean value of the parameter and determining the individual deviation from said mean value for each unit, calculating a standard deviation using the individual deviations, determining a tolerance value equal to a given number times the standard deviation, comparing the value of the parameter for each unit with said tolerance and flagging any values which differ from the mean by more than said tolerance, displaying the value of said parameter for each unit and highlighting any value which is out of limit, making a decision as to whether there were any out of limit values flagged, if not then initiating another scan, or if any value has been flagged then actuating an alarm.

2. The method according to claim 1, wherein said parameter is voltage.

3. The method according to claim 2, used in a system having generating apparatus for charging the battery, and a circuit to supply power to a load from the generating apparatus and/or the battery, in which a low voltage cut out turns off power to the load in response to a low voltage limit, wherein the method further includes the step of determining when the battery has recharged to a preset level, based on the mean battery voltage, and in response thereto of turning the power to the load back on.

4. The method according to claim 1, further including the step of comparing said value of the parameter for each unit to absolute limits, with values outside of the absolute limits being also flagged for actuating the alarm, whereby catastrophic events may be prevented.

* * * * *